United States Patent
Hoehn et al.

(10) Patent No.: US 9,991,609 B2
(45) Date of Patent: Jun. 5, 2018

(54) ELECTRICAL CONNECTION MODULE, SEMICONDUCTOR MODULE AND METHOD FOR PRODUCING A SEMICONDUCTOR MODULE

(71) Applicant: Infineon Technologies AG, Neubiberg (DE)

(72) Inventors: Alexander Hoehn, Soest (DE); Georg Borghoff, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 7 days.

(21) Appl. No.: 14/941,349

(22) Filed: Nov. 13, 2015

(65) Prior Publication Data

US 2016/0141770 A1     May 19, 2016

(30) Foreign Application Priority Data

Nov. 14, 2014   (DE) ................... 10 2014 116 662

(51) Int. Cl.
| | |
|---|---|
| *H01R 4/00* | (2006.01) |
| *H05K 5/00* | (2006.01) |
| *H01R 4/30* | (2006.01) |
| *H01R 4/34* | (2006.01) |
| *H01L 23/48* | (2006.01) |

(Continued)

(52) U.S. Cl.
CPC ............ *H01R 4/301* (2013.01); *H01L 21/50* (2013.01); *H01L 23/48* (2013.01); *H01L 25/072* (2013.01); *H01R 4/34* (2013.01); *H01L 2224/0603* (2013.01); *H01L 2224/48139* (2013.01); *H01L 2224/49111* (2013.01); *H01L 2224/49113* (2013.01); *H01L 2924/00014* (2013.01); *H01R 12/7088* (2013.01); *H05K 5/00* (2013.01)

(58) Field of Classification Search
None
See application file for complete search history.

(56) References Cited

U.S. PATENT DOCUMENTS 5,471,089 A * 11/1995 Nagatomo .............. H01L 23/50
                                                                     257/691
5,956,231 A *  9/1999 Yamada ................ H01L 23/049
                                                                     257/678

(Continued)

FOREIGN PATENT DOCUMENTS

| CN | 1231575 A | 10/1999 |
|---|---|---|
| CN | 2672859 Y | 1/2005 |

(Continued)

*Primary Examiner* — Courtney Smith
*Assistant Examiner* — Rashen E Morrison
(74) *Attorney, Agent, or Firm* — Murphy, Bilak & Homiller, PLLC (57) ABSTRACT

An electrical connection module system includes a first connection plate with a first connection end and at least one first foot section, a first screw nut, and a dielectric holder. The dielectric holder has a first reception region for receiving the first screw nut. The first connection plate can, when the first screw nut is placed in the first reception region, be pushed onto the dielectric holder and be brought into a first target position such that the first screw nut is arranged between the dielectric holder and the first connection end and is held by the first connection end in the first reception region in such a way that the first screw nut cannot fall out.

22 Claims, 8 Drawing Sheets

(51) Int. Cl.
*H01L 21/50* (2006.01)
*H01L 25/07* (2006.01)
*H01R 12/70* (2011.01)

(56) References Cited

U.S. PATENT DOCUMENTS 6,714,414 B1 * 3/2004 Dubovsky ........... H01L 23/4006
 165/185
9,076,660 B2 * 7/2015 Kim .................... H01L 23/053

FOREIGN PATENT DOCUMENTS

| CN | 201181702 Y | 1/2009 |
|---|---|---|
| CN | 102013422 A | 4/2011 |

* cited by examiner

ELECTRICAL CONNECTION MODULE, SEMICONDUCTOR MODULE AND METHOD FOR PRODUCING A SEMICONDUCTOR MODULE

PRIORITY CLAIM

This application claims priority to German Patent Application No. 10 2014 116 662.0 filed on Nov. 14, 2014, the content of said application incorporated herein by reference in its entirety.

TECHNICAL FIELD

The present invention relates to an electrical connection module, to a semiconductor module and to a method for producing a semiconductor module.

BACKGROUND

Semiconductor modules have electrical connections for the purpose of their external electrical connection. Since semiconductor modules often switch very heavy currents, at least the load electrical connections must have a high current-carrying capacity. In previous solutions, the electrical connections are formed by connection ends of metal plates.

According to one variant, the metal plates are fed through the module housing so that the connection ends lie on the outer side of the housing. Subsequently, each connection end is bent in such a way that it covers a screw nut which is placed in a recess of the housing. By it being possible to pass a screw through the connection end and through a connection conductor external to the module and twist it into the screw nut, the connection conductor external to the module can be electrically conductively connected to the connection end. Since thick metal plates are used in order to produce the electrical connections, because of the required high current-carrying capacity, the bending requires strong forces which are transmitted via the metal plate into the interior of the module, so that damage can occur inside the module. Furthermore the bending cannot be carried out with the desired precision, the effect of which is that the height of the semiconductor module cannot be adjusted precisely. If a connection conductor external to the module is intended to be screwed together with a plurality of connection ends thereof or a plurality of neighboring semiconductor modules, this can lead to mechanical stresses and therefore damage of a semiconductor module and/or of the connection conductor external to the module.

According to another variant, during production of the module housing, pre-bent metal plates are injection-molded into the latter so that the connection ends protrude out of the module housing. Since the metal plates and the housing plastic have very different thermal expansion coefficients, because of cyclic thermal loads mechanical stresses can likewise occur, and therefore damage to the semiconductor module.

Another problem which frequently arises with semiconductor modules consists in high stray inductances of the electrical lines built into the module, since in this way undesired high induction voltages can occur in the event of rapid current variations. In order for two lines carrying high voltage to have a low inductance, it is advantageous for these to be configured as flat strips which extend parallel to one another with a small spacing, while being electrically insulated from one another. Such lines, however, can only be produced in a semiconductor module with great outlay. One possibility consists in installing two metal conductors one after the other with a small spacing and electrically insulating them from one another with an encapsulation compound, with which the module housing is subsequently filled and which flows between the two conductors. So that short circuits do not inadvertently occur in this case between the conductors, a sufficient safety distance between them must be set. Because of manufacturing tolerances, however, this needs to be kept relatively large. Another problem may be air inclusions in the encapsulation compound. If such air inclusions occur between the two conductors, for example, the insulation strength is locally reduced there and partial discharges may occur. Another possibility of electrically insulating two conductors from one another is to place prefabricated insulation layers between them. This, however, entails great outlay in terms of manufacturing technology. Furthermore, air inclusions may be formed at the insulation layers during subsequent filling with an optional encapsulation compound, again with the effect that the insulation strength is locally reduced there and partial discharges may occur.

SUMMARY

A first aspect relates to an electrical connection module system. The electrical connection module system comprises a first connection plate with a first connection end and at least one first foot section, as well as a first screw nut and a dielectric holder. The dielectric holder comprises a first reception region for receiving the first screw nut. The first connection plate can, when the first screw nut is placed in the first reception region, be pushed onto the dielectric holder, and thereby brought into a first target position, in such a way that the first screw nut is arranged between the dielectric holder and the first connection end and is held by the first connection end in the first reception region in such a way that it cannot fall out.

A second aspect relates to an electrical connection module having a first connection plate, which comprises a first connection end and at least one first foot section. The connection module furthermore comprises a first screw nut, as well as a dielectric holder comprising a first reception region for receiving the first screw nut. The first screw nut is placed in the first reception region and the first connection plate is pushed onto the dielectric holder in such a way that the first screw nut is arranged between the dielectric holder and the first connection end and is held by the first connection end in the first reception region in such a way that it cannot fall out.

A third aspect relates to a semiconductor module. The semiconductor module comprises a module housing as well as a circuit carrier having a first metallization, and an electrical connection module configured according to the second aspect. At least one first foot section is electrically conductively connected to the first metallization.

A fourth aspect relates to a method for producing a semiconductor module. To this end, a circuit carrier having a first metallization, an electrical connection module configured according to the second aspect, and a module housing element are provided. The module housing element is arranged on the circuit carrier, and the electrical connection module is pushed onto the module housing element, before or after the latter is arranged on the circuit carrier, specifically in such a way that a first foot region is arranged above the first metallization. An electrically conductive connection is produced between the first metallization and the first connection plate on the first foot region.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 7 shows a plan view of the partially finished semiconductor module after a connection module configured according to FIGS. 1, 2 and 4 has been fitted on.

DETAILED DESCRIPTION

Figure 1:
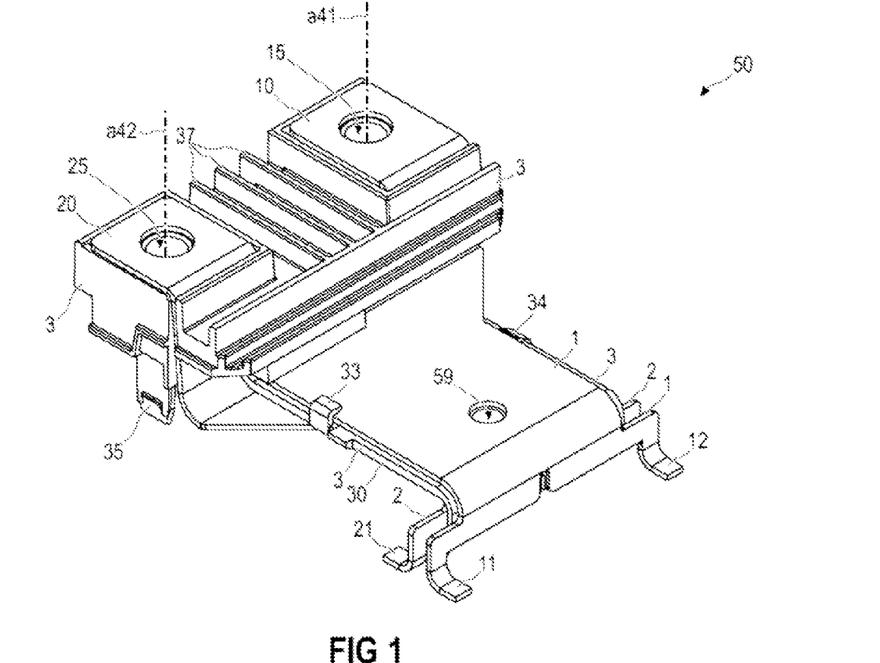
FIG. 1 shows a perspective view of an electrical connection module.
Figure 2:
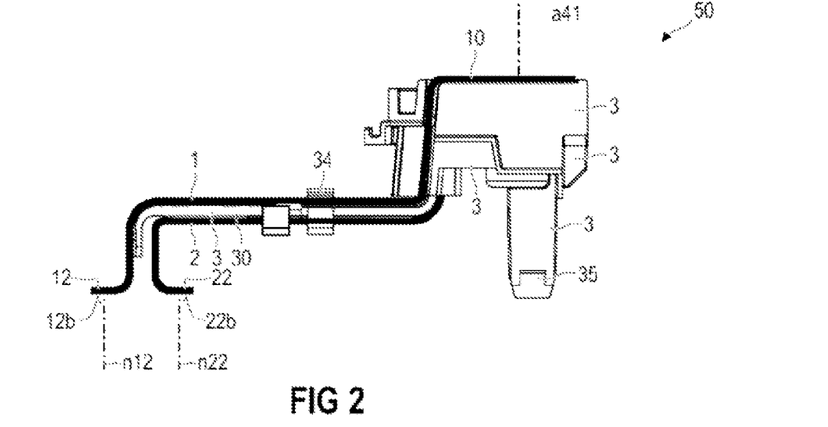
FIG. 2 shows a side view of the connection module represented in FIG. 1.
Figure 3:
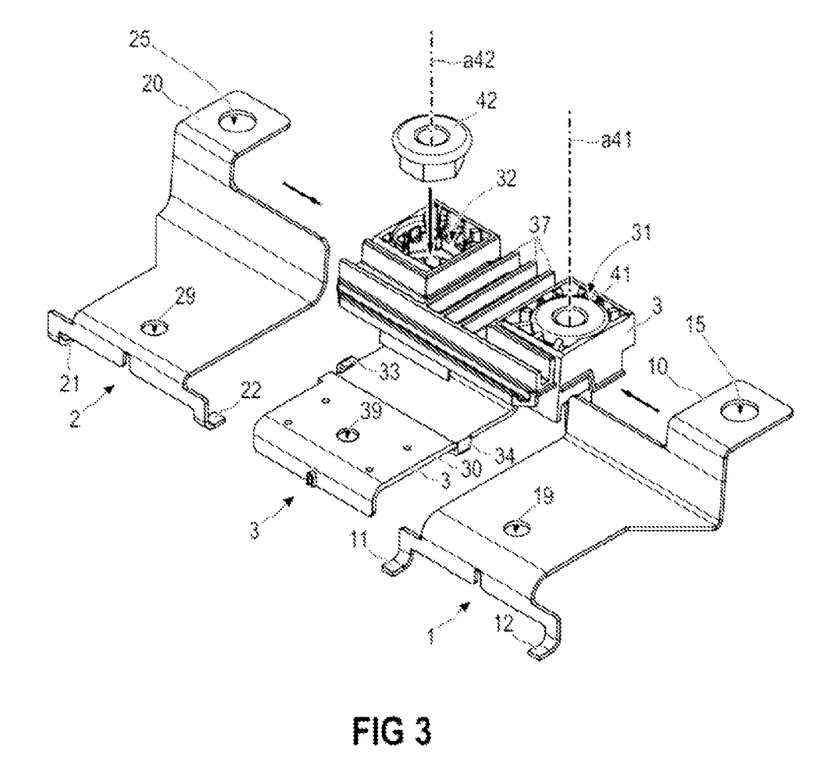
FIG. 3 shows an exploded representation of the connection module represented in FIGS. 1 and 2.
Figure 4:
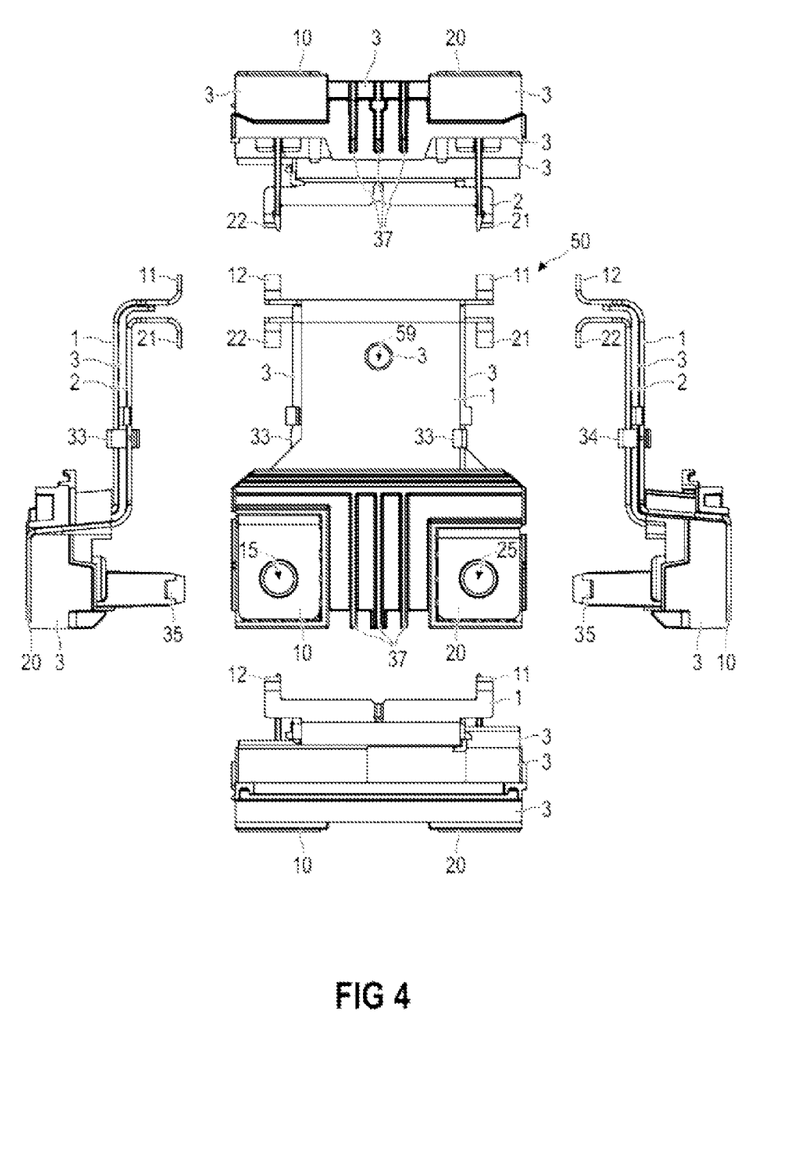
FIG. 4 shows a plan view and four side views of the connection module represented in FIGS. 1 and 2.

FIG. 1 shows a perspective view of an electrical connection module 50, FIG. 2 shows a side view thereof, FIG. 3 shows an exploded representation thereof, and FIG. 4 shows a plan view (central image) and four side views thereof.

The connection module 50 comprises an electrically conductive first connection plate 1 having a first connection end 10 and two first foot sections 11 and 12. In principle, the first connection plate 1 has at least one first foot section 11, 12, although it may also comprise precisely or at least two first foot sections 11, 12. Furthermore, the connection module 50 comprises a first screw nut 41 having a first thread axis a41, and a dielectric holder 3. A first reception region 31 of the dielectric holder 3 is used to receive the first screw nut 41.

When the first screw nut 41 is placed in the first reception region 31 (FIG. 3), the first connection plate 1 can be pushed onto the dielectric holder 3, and thereby brought into a first target position (FIGS. 1, 2 and 4), in such a way that the first screw nut 41 is arranged between the dielectric holder 3 and the first connection end 10 and is held by the first connection end 10 of the first connection plate 1 in the first reception region 31 in such a way that it cannot fall out.

Optionally, the dielectric holder 3 may comprise at least one first latch element 33, for example a resilient latching hook, which holds the first connection plate 1 in the first target position.

Likewise optionally, the first connection end 10 may comprise a first feed-through 15 through which, when the first connection plate 1 is in the first target position, a first screw can be fed and screwed to the first screw nut 41. The first feed-through 15 may for example be configured as a through-opening (for example as a bore), or as a U-shaped cutout which extends laterally into the first connection end 10.

In order to prevent the first screw nut 41 from turning when a screw is screwed into it, the first reception region 31 is configured in such a way that it blocks the first screw nut 41 placed in it in the event of rotation of the first screw nut 41 about its thread axis a41. The first screw nut 41 may in this case be placed loosely in the first reception region 31. It may also have some degree of mobility about its thread axis a41, although the dielectric holder 3 has a stop in the first reception region 31, on which the first screw nut 41 bears when it is turned when a screw is being screwed in.

The connection module 50 may optionally also have a second connection plate 2 comprising a second connection end 20 and at least one second foot section 21, 22. In principle, a second connection plate 2 has at least one second foot section 21, 22, although it may also comprise precisely or at least two second foot sections 21, 22. Furthermore, the connection module 50 comprises a second screw nut 42 having a second thread axis a42. A second reception region 32 of the dielectric holder 3 is used to receive the second screw nut 42.

When the second screw nut 42 is placed in the second reception region 32 (FIG. 3), the second connection plate 2 can be pushed onto the dielectric holder 3, and thereby brought into a second target position (FIGS. 1, 2 and 4), in such a way that the second screw nut 42 is arranged between the dielectric holder 3 and the second connection end 20 and is held by the second connection end 20 of the second connection plate 2 in the second reception region 32 in such a way that it cannot fall out.

Optionally, the dielectric holder 3 may comprise at least one second latch element 34, for example a resilient latching hook, which holds the second connection plate 2 in the second target position.

Likewise optionally, the second connection end 20 may comprise a second feed-through 25 through which, when the second connection plate 2 is in the second target position, a second screw can be fed and screwed to the second screw nut 42. The second feed-through 25 may for example be configured as a through-opening (for example as a bore), or as a U-shaped cutout which extends laterally into the second connection end 20.

In order to prevent the second screw nut 42 from turning when a screw is screwed into it, the second reception region 32 is configured in such a way that it blocks the second screw nut 42 placed in it in the event of rotation of the second screw nut 42 about its thread axis a42. The second screw nut 42 may in this case be placed loosely in the second reception region 32. It may also have some degree of mobility about its thread axis a42, although the dielectric holder 3 has a stop in the second reception region 32, on which the second screw nut 42 bears when it is turned when a screw is being screwed in.

Optionally, the dielectric holder 3 may be configured in such a way that the first connection plate 1 and the second connection plate 2 can be pushed onto it from opposite sides, and therefore can respectively be brought into their first or second target positions.

The foot sections 11, 12, 21, 22 (if present), respectively have a lower side (in FIG. 2, only the lower sides 12b and 22b of the foot sections 12 and 22, respectively can be seen) on which they may be connected to a circuit carrier, for example by soldering, sintering or welding (for example ultrasound or laser welding) or electrically contacted in another way. The lower side of each of the foot sections 11, 12, 21, 22 may optionally comprise a planar section.

When the first screw nut 41 and optionally the second screw nut 42 are placed as explained in their respective reception regions 31 and 32, and the first connection plate 1 and optionally the second connection plate 2 are in their respective target positions, the surface normal (in FIG. 2, only the surface normals n12 and n22 of the planar sections of the lower sides 12b and 22b of the foot sections 12 and 22, respectively, can be seen) of each of the planar sections may optionally extend parallel to one or both of the thread axes a41, a42, respectively, of the first and second screw nuts 41, 42.

The dielectric holder 3 can optionally have an e.g. tongue-shaped projection 30, which is arranged between a tongue-shaped projection of the first connection plate 1 and a tongue-shaped projection of the second connection plate 2 and electrically insulates the connection plates 1, 2 from one another when they are in their respective target positions on the dielectric holder 3.

Optionally, a connection module 50, when its connection plates 1 and 2 are in their respective target positions, may comprise one or more through-openings 59 (FIG. 1), each of which comprises three partial through-openings 19, 29, 39 arranged behind one another (FIG. 3), and of which a first partial through-opening 19 is formed in the first connection plate 1, a second partial through-opening 29 is formed in the second connection plate 2, and a third partial through-opening 39 is formed in the dielectric holder 3, for example in its tongue-shaped projection 30.

The dielectric holder 3 may in this case be configured in such a way that, in a first plan view of the through-opening 59, the edge of the first partial through-opening 19 is visible over its entire circumference and the edge of the second partial through-opening 29 is fully covered by the dielectric holder 3. As an alternative or in addition, the dielectric holder 3 may be configured in such a way that, in a second plan view of the through-opening 59, the edge of the second partial through-opening 29 is visible over its entire circumference and the edge of the first partial through-opening 19 is fully covered by the dielectric holder 3. If both criteria apply, the first plan view and the second plan view may represent views from opposite directions. The effect of this is that, in each of the opposite directions, the boundary of the through-opening 59 is determined only by the third partial through-opening 39.

If the dielectric holder 3 comprises latch elements 33 and/or 34, the first connection plate 1 or the second connection plate 2 can be pushed onto it so far that they latch on the latch element 33 or 34, respectively, when they reach the first or second target position.

In the mounted state of the connection module 50, the first connection plate 1 and/or the second connection plate 2 may be pushed loosely into the dielectric holder 3, i.e. without there being a material-fit connection between the first or second connection plate 1, 2 and the dielectric holder 3.

The dielectric holder 3 may be formed in one or more parts. It may consist of plastic or comprise plastic. The plastic may, for example, be a thermoset or a thermoplastic. The dielectric holder 3 may be produced in any desired way. It can be produced particularly efficiently by injection molding.

The dielectric holder 3 is used to receive one or more connection plates 1, 2 and fix them in respective target positions, as well as to provide a reception region 31, 32, respectively, in order to receive one or more screw nuts 41, 42.

In the case of two or more connection plates 1, 2, the dielectric holder 3 may also be used to electrically insulate various ones of the connection plates 1, 2 from one another. This may, above all, be expedient when, during subsequent operation, for example when the finished connection module 50 is used in a semiconductor module, high voltages, for example at least 300 V, at least 600 V, at least 900 V, at least 1.5 kV, at least 2.8 kV or even at least 3.6 kV, are applied between the connection plates 1, 2 to be insulated from one another. In order to achieve a good insulation strength, the connection module 50 may be configured in such a way that there is a section of the dielectric holder 3 between each first position of the first connection plate 1 and each second position, separated from the first position by less than a predetermined distance, for example of 2 mm or 4 mm, of the second connection plate 2.

A connection module 50 as described above is suitable, for example, for the production of a semiconductor module. This will be explained below with the aid of an example shown in FIGS. 5 to 8.

Figure 5:
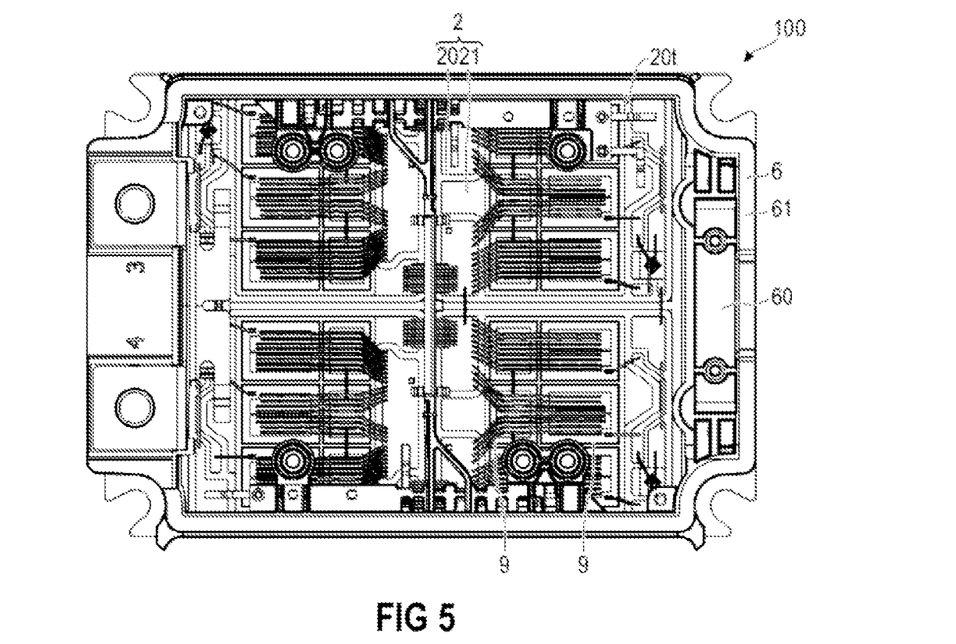
FIG. 5 shows a plan view of a partially finished semiconductor module, onto which a connection module configured according to FIGS. 1, 2 and 4 is subsequently fitted.
Figure 6:
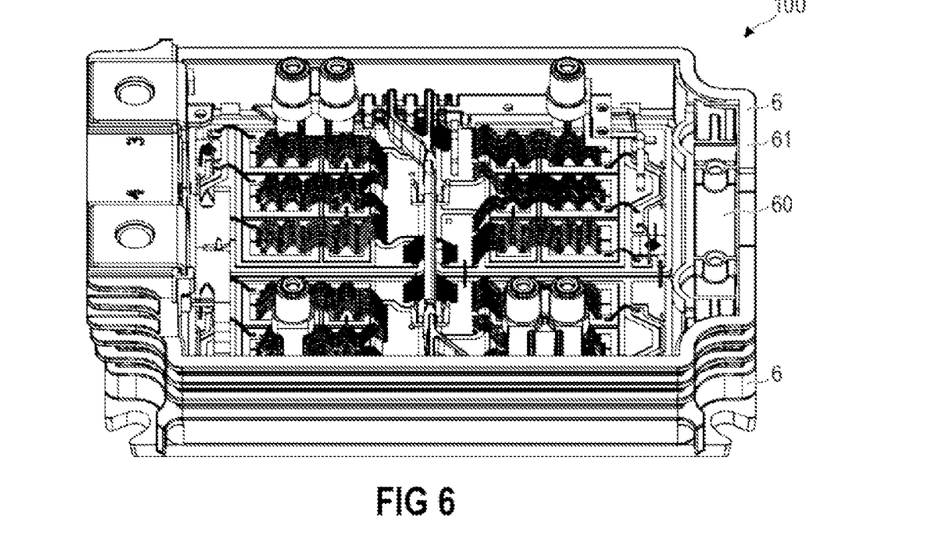
FIG. 6 shows a perspective view of the partially finished semiconductor module according to FIG. 5.

FIG. 5 shows a perspective view, and FIG. 6 a plan view, of a semi-finished semiconductor module 100. This comprises a housing element 61 of a module housing 6, as well as a circuit carrier 2 onto which is fitted the housing element 61. The housing element 61 may for example be a housing side wall, and in particular a housing side wall in the shape of a frame.

The circuit carrier 2 comprises a dielectric insulation carrier 20 having an upper side 20t, onto which an upper metallization layer 21 is applied, as well as an optional lower metallization layer (concealed in FIGS. 5 to 8) which is applied onto a lower side 20b, facing away from the upper side 20t, of the dielectric insulation carrier 20. If an upper metallization layer 21 and a lower metallization layer are present, these may thus lie on mutual opposite sides of the insulation carrier 20. The upper metallization layer 21 if necessary may be structured so that it has conductive tracks, which may for example be used for electrical interconnection and/or for chip mounting. The dielectric insulation carrier 20 may be used to insulate the upper metallization layer 21 and the lower metallization layer electrically from one another.

The circuit carrier 2 may be a ceramic substrate in which the insulation carrier 20 is formed as a thin layer, which comprises ceramic or consists of ceramic. Suitable materials for the upper metallization layer 21 and, if present, the lower metallization layer, are highly electrically conductive metals such as for example copper or copper alloys, aluminum or aluminum alloys, but also any other desired metals or alloys. If the insulation carrier 20 comprises ceramic or consists of ceramic, the ceramic may for example be aluminum oxide (Al$_2$O$_3$) or aluminum nitride (AlN) or silicon nitride (Si$_3$N$_4$) or zirconium oxide (ZrO$_2$), or a mixed ceramic which, besides at least one of the aforementioned ceramic materials, also comprises at least one further ceramic material different therefrom. For example, a circuit carrier 2 may be configured as a DCB substrate (DCB=Direct Copper Bonding), as a DAB substrate (DAB=Direct Aluminum Bonding), as an AMB substrate (AMB=Active Metal Brazing) or as an IMS substrate (IMS=Insulated Metal Substrate). The upper metallization layer 21 and, if present, the lower metallization layer may independently of one another respectively have a thickness in the range of from 0.05 mm to 2.5 mm. The thickness of the insulation carrier 20 may, for example, lie in the range of from 0.1 mm to 2 mm. Thicknesses greater or less than those indicated are, however, likewise possible.

The circuit carrier 2 may be fitted with one or more electronic parts 9. In principle, any desired electronic parts 9 may be used. In particular, such an electronic part 9 may contain any desired active or passive electronic component. It is also possible for one or more active electronic components and one or more passive electronic components to be integrated together in an electronic part 9. For example, an electronic part 9 may be configured as a semiconductor chip and comprise a semiconductor body.

A part 9 may for example contain a diode, or a controllable semiconductor switch, which can be driven via a control input (for example a gate or base input 13) for example a MOSFET (Metal Oxide Semiconductor Field Effect Transistor), an IGBT (Insulated Gate Bipolar Transistor), a thyristor, a JFET (Junction Field Effect Transistor), an HEMT (High Electron Mobility Transistor).

In order to connect a circuit produced on the circuit carrier 2 electrically to a component external to the module, for example a printed circuit board, a ribbon cable, a busbar, etc., a connection module 50 as explained above is used. The connection module 50 may, for example, be fitted onto the housing element 61 while optionally being latched thereto with the aid of one or more latch devices 35 of the connection module 50 (see, for example, FIGS. 1 to 4). To this end, the housing element 61 may comprise a reception region 60, into which the connection module 50 is inserted. In order to insert the connection module 50, the latter may for example be pushed onto the housing element 61 in a direction parallel to the thread axes a41, a42 of the first screw nut 41 and/or—if present—of the second screw nut 42.

After mounting of the connection module 50 on the housing element 61, and after fitting of the housing element 61 on the circuit carrier 2, the foot sections 11, 12, 21, 22 (if present) lie at target positions in the region of metallizations of the circuit carrier 2, or of an element mounted on the circuit carrier 2, and can then be connected electrically conductively and with a material fit in any desired way to the relevant metallization (for example a section of the upper metallization layer 21). Suitable connection techniques are, for example, welding (for example ultrasound welding or laser welding) and soldering (for example hard soldering or soft soldering) or sintering (for example of a metal powder, for example a silver powder). The mounting of the connection module on the housing element 61 may in this case be carried out before or after the housing element 61 is placed on the circuit carrier 2.

If a connection plate 1, 2 comprises two or more foot sections 11, 12 and 21, 22, respectively, all the foot sections 11, 12 or 21, 22 of this connection plate 1 or 2 may optionally be connected to the same first or second metallization, although they may also be connected to different metallizations. Optionally, the connection may in this case respectively be carried out on a planar section of the lower side of the relevant foot section 11, 12, 21, 22 (see the lower sides 12b and 22b of the foot sections 12 and 22 in FIG. 2).

Connection plates 1, 2 may consist of metal. In order to achieve good electrical conductivity, they may respectively consist for example of copper, of a copper alloy, and/or at least 90% by weight copper.

Figure 7:
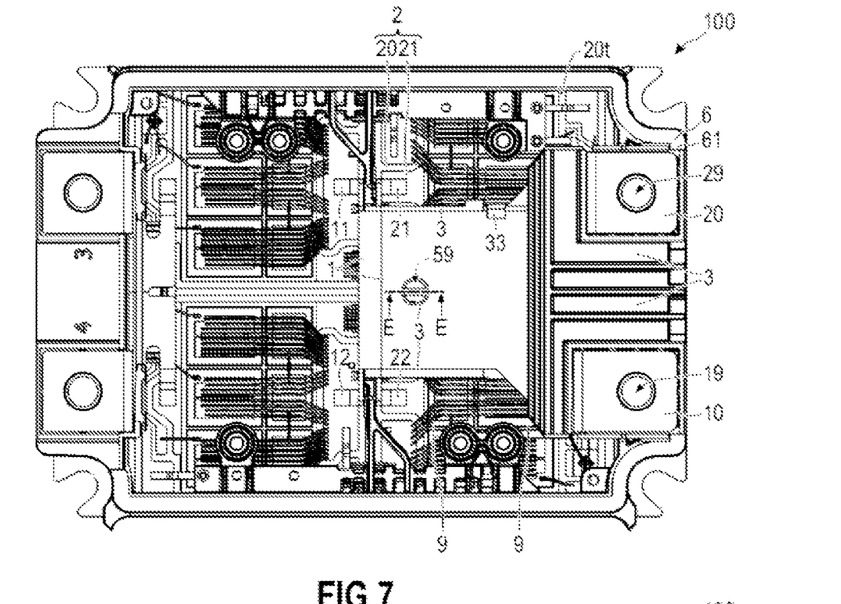
Figure 8:
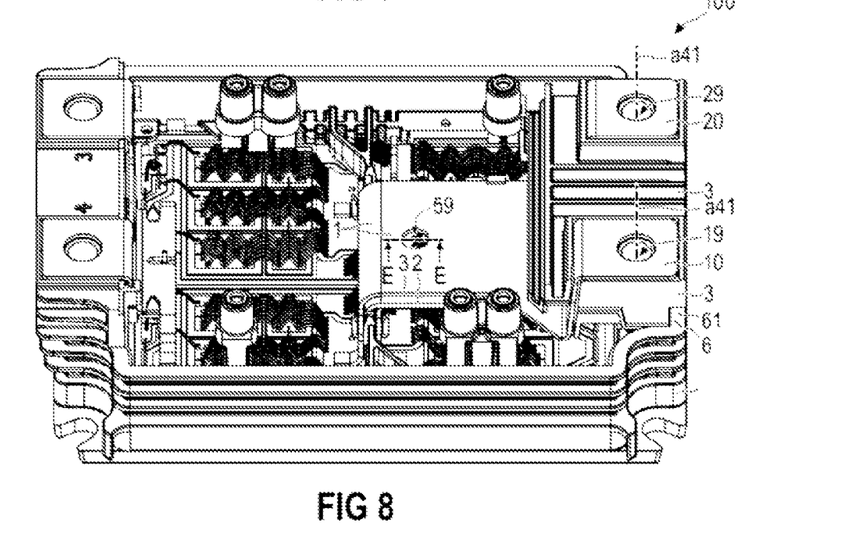
FIG. 8 shows a perspective view of the partially finished semiconductor module according to FIG. 7.

FIGS. 7 and 8 show the semi-finished semiconductor module 100 after mounting of the connection module 50 on the housing element 61 and after fitting of the housing element 61 on the circuit carrier 2, as well as after the material-fit connection of the foot sections 11, 12 or 21, 22 to the respective metallization. In this state, the thread axis a41 of the first screw nut 41 and the thread axis a42 of the second screw nut 42 (if the latter is present) may extend perpendicularly to the upper side 20t of the insulation carrier 20.

Figure 9:
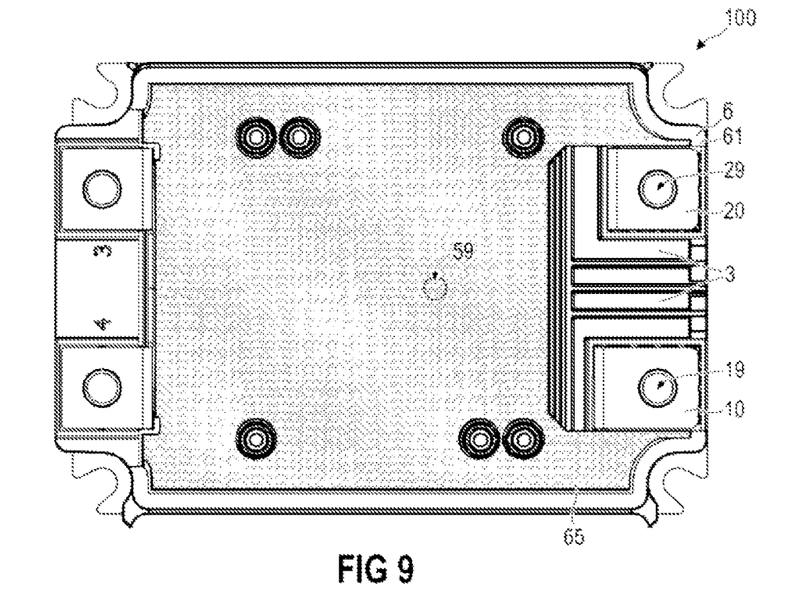
FIG. 9 shows a plan view of the partially finished semiconductor module according to FIGS. 7 and 8 after the module housing has been filled with an encapsulation compound.

The semi-finished semiconductor module 100 may then be finished. For example, as shown in the plan view according to FIG. 9, an internal space of the module housing 6, for example a trough formed with the aid of the circuit carrier 2 and of the housing element 61, may also be filled with a dielectric encapsulation compound 65, for example a silicone gel, so that the encapsulation compound covers at least the electronic parts 9 installed on the circuit carrier 2 and optionally also bonding wires placed on the circuit carrier 2. In this case—if present—one or more through-openings 59 may be fully filled with the encapsulation compound 65. In FIG. 9, the position of the through-opening 59 shown in FIGS. 7 and 8, which is covered by the encapsulation compound 65, is represented by dashes.

Figure 10:
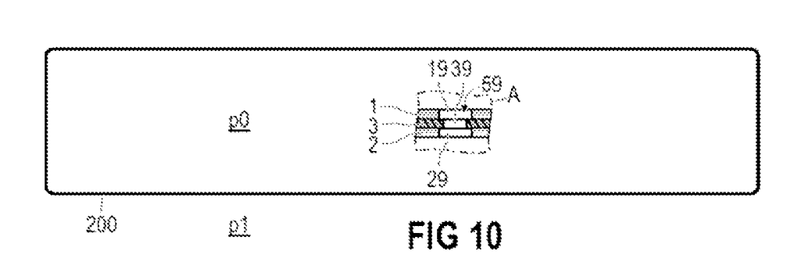
FIG. 10 shows a cross section through a section of the connection module of the partially finished semiconductor module according to FIGS. 7 and 8 before the module housing is filled with the encapsulation compound.

Optionally, the filling with the encapsulation compound 65 may be carried out under reduced pressure. To this end, the semi-finished semiconductor module fitted with at least one connection module 50, for example a semi-finished semiconductor module as explained with the aid of FIGS. 7 and 8, is introduced into an evacuable chamber 200 and the gas pressure prevailing in the chamber 200 is reduced to a pressure or a pressure range which lies below the pressure p0 of the atmosphere surrounding the chamber 200, which is shown in FIG. 10 by way of example with the aid of a cross section through a section, comprising a through-opening 59, of a connection module 50 of the semi-finished semiconductor module according to FIGS. 7 and 8 in a section plane E-E. For example, the reduced (absolute) gas pressure p1 existing in the chamber 200 may be less than 50 hPa, less than 20 hPa, or even less than 10 hPa.

Figure 11:
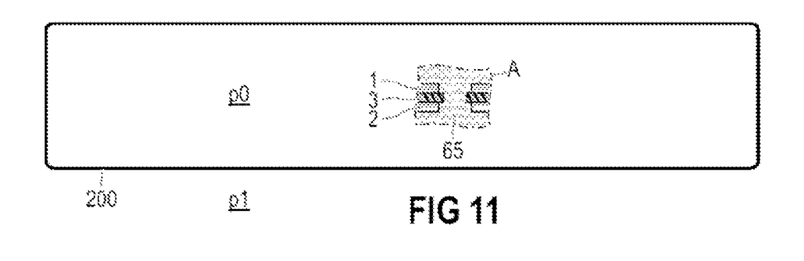
FIG. 11 shows a cross section through a section according to FIG. 10 after the module housing has been filled with the encapsulation compound.

The filling of the internal space of the module housing 6 with the encapsulation compound 65 is carried out at the reduced pressure p1, the result of this being shown in FIG. 11. As can likewise be seen in FIG. 11, one or more through-openings 59 of a connection module 50 may in this case be fully filled with the encapsulation compound 65.

After filling with the encapsulation compound 65, the semi-finished semiconductor module is again exposed to the ambient pressure p0 by opening the chamber 200. Possible gas inclusions (for example air) in the encapsulation compound 65 are thereby compressed, so that their volume is reduced, which increases the insulation strength of the encapsulation compound 65.

The connection ends 10, 20 (if present) may in principle be used to transmit any desired electrical currents, voltages, signals, etc., to the semiconductor module. For example, a supply voltage, for example at least 300 V, at least 600 V, at least 900 V, at least 1.5 kV, at least 2.8 kV or even at least 3.6 kV, for the electrical supply of the semiconductor module may be applied between the connection ends 10 and 20.

In order to avoid electrical discharges and/or to lengthen leakage paths, the dielectric holder 3 may comprise one or more fins 37 (see, for example, FIGS. 1, 2 and 4) which extend transversely between the first connection end 10 and the second connection end 20.

Figure 12:
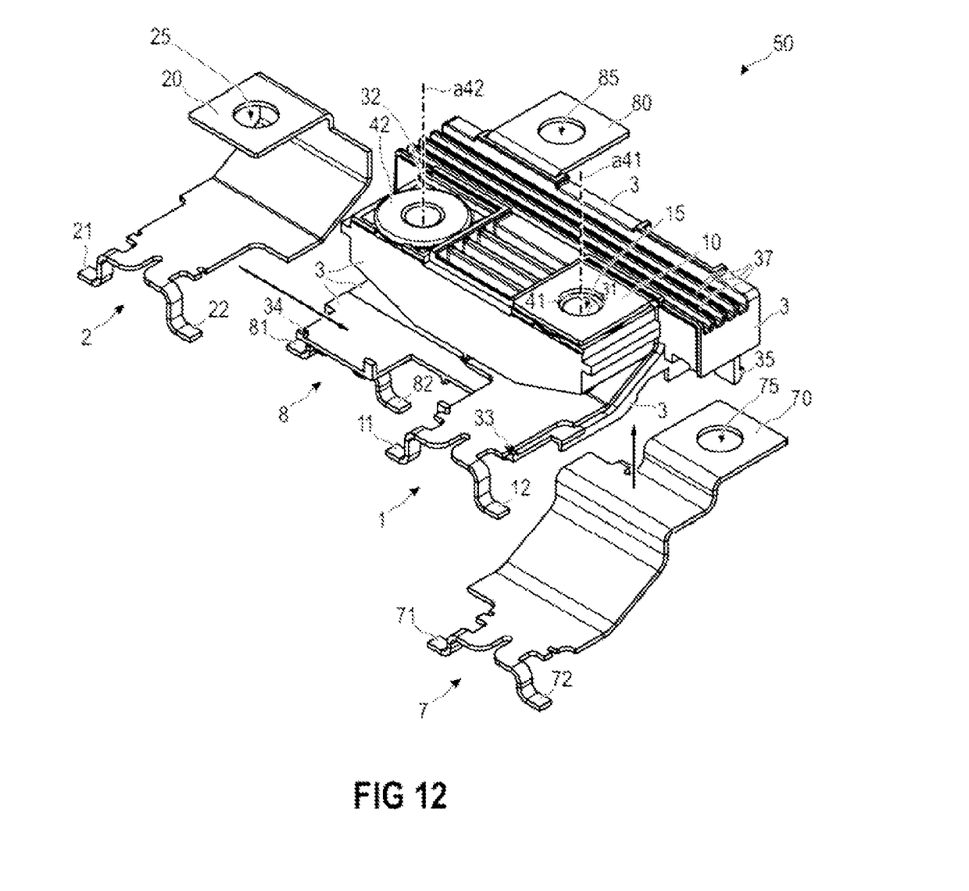
FIG. 12 shows an exploded representation of a connection module which comprises four connection plates.
Figure 13:
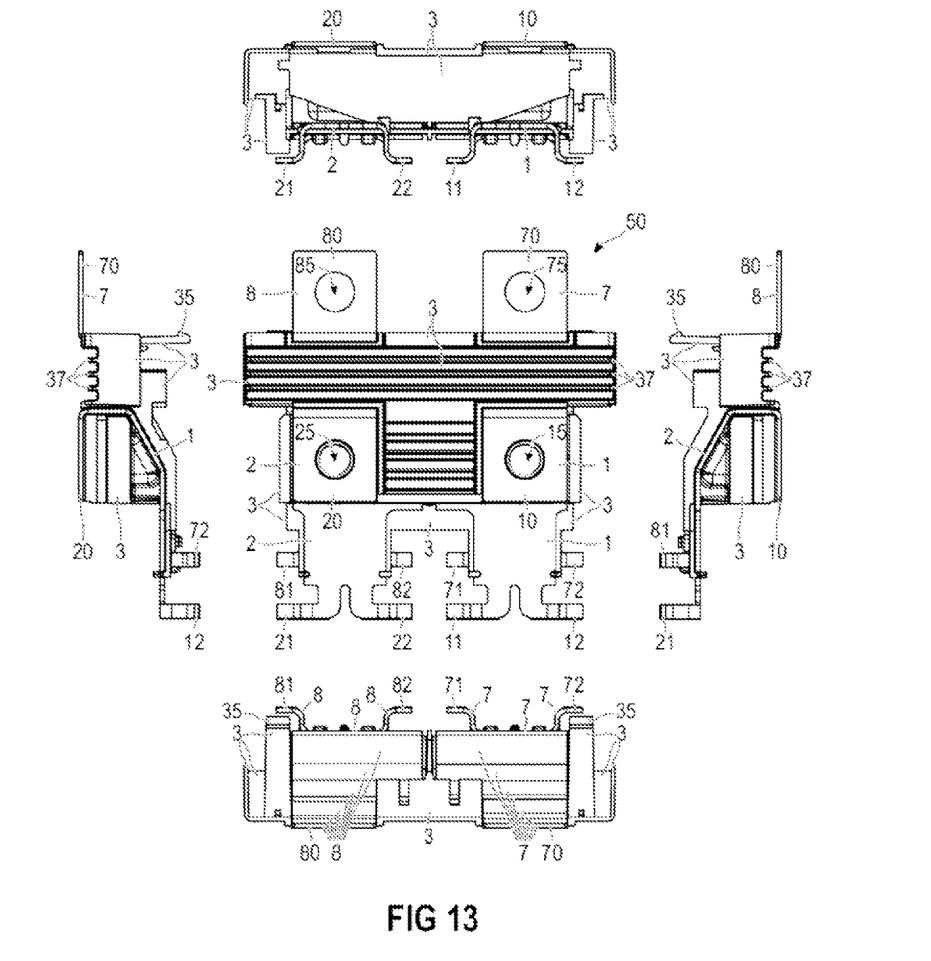
FIG. 13 shows a plan view and four side views of the connection module represented in FIG. 12.

The connection modules 50 explained above comprise one or two connection plates 1, 2. In principle, however, the number of connection plates of a connection module 50 may be selected in any desired way. This will be explained with reference to a connection module 50 which, by way of example, comprises four connection plates 1, 2, 7, 8. FIG. 12 shows an exploded representation thereof. FIG. 13 shows a plan view (central image) and four side views thereof.

The connection module 50 comprises an electrically conductive first connection plate 1 having a first connection end 10 and two first foot sections 11 and 12, an electrically conductive second connection plate 2 having a second connection end 20 and two second foot sections 21 and 22, an electrically conductive third connection plate 7 having a third connection end 70 and two third foot sections 71 and 72, and an electrically conductive fourth connection plate 8 having a fourth connection end 80 and two fourth foot sections 81 and 82. In principle, each connection plate 1, 2, 7, 8 comprises at least one foot section 11, 12, 21, 22, 71, 72, 81, 82.

Optionally, the dielectric holder 3 may be configured in such a way that the first connection plate 1 and the second connection plate 2 (if both are present) can be pushed onto it from opposite sides and thereby brought respectively into their first and second target positions.

As already explained with the aid of the exemplary embodiments above, the connection module 50 comprises a dielectric holder 3, as well as a first screw nut 41 having a first thread axis a41 and a second screw nut 42 having a second thread axis a42. A first and a second reception region 31 and 32, respectively, of the dielectric holder 3 are used to receive the first and second screw nuts 41 and 42.

When the first screw nut 41 has been placed in the first reception region 31, the first connection plate 1 can be pushed onto the dielectric holder 3, and thereby brought into a first target position, in such a way that the first screw nut 41 is arranged between the dielectric holder 3 and the first connection end 10 and is held by the first connection end 10 of the first connection plate 1 in the first reception region 31 in such a way that it cannot fall out.

Correspondingly, when the second screw nut 42 is placed in the second reception region 32, the second connection plate 2 can be pushed onto the dielectric holder 3, and thereby brought into a second target position in such a way that the second screw nut 42 is arranged between the dielectric holder 3 and the second connection end 20 and is held by the second connection end 20 of the second connection plate 2 in the second reception region 32 in such a way that it cannot fall out.

Unlike in the case of the connection module 50 shown with the aid of FIGS. 1 to 4, when they are in their respective target positions, the first and second connection plates 1, 2 are arranged next to one another, although a tongue-shaped section of the dielectric holder 3 could also be arranged between the first and second connection plates 1, 2 when the connection plates 1 and 2 are in their respective target positions. Moreover, the features of the connection module 50 explained with the aid of FIGS. 1 to 4 apply, including the variants explained. If there is a third or fourth connection plate 7, 8, this may consist of one of the materials already mentioned for the first and second connection plates 1, 2.

Unlike the first and second connection plates 1, 2, the third and fourth connection plates 7, 8 are not pushed onto the dielectric holder 3 from opposite sides, but are fitted onto the dielectric holder 3 from the same side of the dielectric holder 3 in a direction parallel to the thread axes a41 and/or a42.

Optionally, the third connection end 70 may comprise a third feed-through 75 and/or the fourth connection end 80 may comprise a fourth feed-through 85. These may be configured as a through-opening (for example as a bore), or as a U-shaped cutout which extends laterally into the third or fourth connection end 70 or 80.

After the screw nuts 41, 42 (if present) have been placed in the respective reception regions 31 and 32 of the dielectric holder 3 and the first and second connection plates 1, 2 (if present) have subsequently been pushed onto the dielectric holder 3, the connection module 50 may be fitted in the manner already explained with the aid of FIGS. 5 to 9 onto a housing element of a semi-finished semiconductor module, while optionally being latched on to the housing element with the aid of one one or more latch devices 35 of the connection module 50. To this end, the housing element may comprise a reception region into which the connection module 50 is inserted. For insertion of the connection module 50, the latter may for example be pushed onto the housing element in a direction parallel to the direction of the thread axes a41, a42 of the first screw nut 41 and/or—if present—of the second screw nut 42. The direction of the thread axes a41, a42 in this case relates to their position relative to the dielectric holder 3 when the relevant screw nut 41, 42 is placed in the associated reception region of the dielectric holder 3. The screw nuts 41 and/or 42 may, but need not, already be placed in the respective reception regions 31 and 32 when the third or fourth connection plate 7 or 8 is fitted on.

The order in which the connection plates 1, 2, 3, 4 (if present) are mounted on the dielectric holder 3, and thereby brought into their respective target position on the dielectric holder 3, is in principle arbitrary. It is merely necessary to take care that the placement of a screw nut 41, 42 (if present) in a reception region 31 or 32, respectively, of the dielectric holder 3 must be carried out before the first or second connection plate 1 or 2 is brought into the respective target position.

As can likewise be seen with the aid of FIG. 12, the pushing of the first and/or second connection plate 1, 2 onto the dielectric holder 3 can be carried out parallel to a first direction r1 and the fitting of the third and/or fourth connection plate 7, 8 onto the dielectric holder 3 is carried out in a second direction r2 different to the first direction r1. The first direction r1 and the second direction r2 are not parallel to one another. They may make any desired angle not equal to 0° or 180°, for example an angle of 90°.

After the connection module 50 has been mounted on the housing or housing element, the housing interior may, as already explained above, optionally also be filled with an encapsulation compound, for example a silicone gel. Optionally, the connection module 50 may likewise comprise corresponding through-openings 57. If in this case connection plates 1, 2, 3, 4 or one or more tongue-shaped sections 30 of the dielectric holder 3 are arranged above one another in the manner of a stack in the region of the relevant through-opening, these may respectively have a partial through-opening. The partial through-openings belonging to a through-opening are then arranged behind one another, in which case they together form the relevant through-opening.

The connection ends 10, 20, 70, 80 (if present) may in principle be used to transmit any desired electrical currents, voltages, signals, etc., to the semiconductor module. For example, the first and second connection plates 1, 2 may be electrically connected to one another at their foot regions 11, 12, 21, 22 (if present), for example with the aid of the circuit carrier 2, so that they are essentially at a common first electrical potential, and the third and fourth connection plates 7, 8 may be electrically connected to one another at their foot regions 71, 72, 81, 82 (if present), for example with the aid of the circuit carrier 2, so that they are essentially at a common second electrical potential. During operation of the semiconductor module, the first and second electrical potentials may differ significantly, for example by at least 300 V, at least 600 V, at least 900 V, at least 1.5 kV, at least 2.8 kV or even at least 3.6 kV. In order in this case to avoid electrical discharges between the first and second connection plates 1, 2 (if present) on the one hand, and the third and fourth connection plates 7, 8 (if present) on the other hand, and/or in order to lengthen leakage paths, the dielectric holder 3 may comprise one or more fins 37 (see FIGS. 12 and 13) which extend transversely between the first and second connection ends 10, 20 on the one hand, and the third and fourth connection ends 70, 80 on the other hand.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electrical connection module system, comprising:
    a first connection plate comprising a first connection end and at least one first foot section;
    a second connection plate comprising a second connection end and at least one second foot section;
    a first screw nut;
    a second screw nut; and
    a dielectric holder comprising a first reception region for receiving the first screw nut,
    wherein the first connection plate, when the first screw nut is placed in the first reception region, can be pushed onto the dielectric holder so as to be brought into a first target position in which the first screw nut is arranged between the dielectric holder and the first connection end and is held by the first connection end in the first reception region in such a way that the first screw nut cannot fall out,
    wherein the dielectric holder further comprises a second reception region for receiving the second screw nut,
    wherein the second connection plate, when the second screw nut is placed in the second reception region, can be pushed onto the dielectric holder so as to be brought into a second target position such that the second screw nut is arranged between the dielectric holder and the second connection end and is held by the second connection end in the second reception region in such a way that the second screw nut cannot fall out,
    wherein the second reception region is configured to block the second screw nut placed in the second reception region in the event of rotation of the second screw nut about a thread axis of the second screw nut.

2. The electrical connection module system of claim 1, wherein the dielectric holder comprises at least one first latch element which holds the first connection plate in the first target position.

3. The electrical connection module system of claim 1, wherein the first connection end comprises a first feed-through through which, when the first connection plate is in the first target position, a first screw can be fed and screwed to the first screw nut.

4. The electrical connection module system of claim 1, wherein the first reception region is configured so as to block the first screw nut placed in the first reception region in the event of rotation of the first screw nut about a thread axis of the first screw nut.

5. The electrical connection module system of claim 1, wherein the dielectric holder comprises at least one second latch element which holds the second connection plate in the second target position.

6. The electrical connection module system of claim 1, wherein the second connection end comprises a second feed-through through which, when the second connection plate is in the second target position, a second screw can be fed and screwed to the second screw nut.

7. The electrical connection module system of claim 1, further comprising one or more through-openings each of which comprises three partial through-openings arranged behind one another, of which:
    a first partial through-opening is formed in the first connection plate;
    a second partial through-opening is formed in the second connection plate; and
    a third partial through-opening is formed in the dielectric holder.

8. The electrical connection module system of claim 1, further comprising at least one further connection plate comprising a further connection end and at least one further foot section and which can be fitted onto the dielectric holder until an associated further target position is reached.

9. An electrical connection module system, comprising:
    a first connection plate comprising a first connection end and at least one first foot section;
    a second connection plate comprising a second connection end and at least one second foot section;
    a first screw nut;
    a second screw nut; and
    a dielectric holder comprising a first reception region for receiving the first screw nut,
    wherein the first connection plate, when the first screw nut is placed in the first reception region, can be pushed onto the dielectric holder so as to be brought into a first target position in which the first screw nut is arranged between the dielectric holder and the first connection end and is held by the first connection end in the first reception region in such a way that the first screw nut cannot fall out,
    wherein the dielectric holder further comprises a second reception region for receiving the second screw nut,
    wherein the second connection plate, when the second screw nut is placed in the second reception region, can be pushed onto the dielectric holder so as to be brought into a second target position such that the second screw nut is arranged between the dielectric holder and the second connection end and is held by the second connection end in the second reception region in such a way that the second screw nut cannot fall out, wherein the dielectric holder is configured such that the first connection plate and the second connection plate can be pushed onto the dielectric holder from opposite sides, and can be brought into the respective first and second target positions.

10. The electrical connection module system of claim 9, wherein the dielectric holder comprises at least one first latch element which holds the first connection plate in the first target position.

11. The electrical connection module system of claim 9, wherein the first connection end comprises a first feed-through through which, when the first connection plate is in the first target position, a first screw can be fed and screwed to the first screw nut.

12. The electrical connection module system of claim 9, wherein the first reception region is configured so as to block the first screw nut placed in the first reception region in the event of rotation of the first screw nut about a thread axis of the first screw nut.

13. The electrical connection module system of claim 9, wherein the dielectric holder comprises at least one second latch element which holds the second connection plate in the second target position.

14. The electrical connection module system of claim 9, wherein the second connection end comprises a second feed-through through which, when the second connection plate is in the second target position, a second screw can be fed and screwed to the second screw nut.

15. The electrical connection module system of claim 9, further comprising one or more through-openings each of which comprises three partial through-openings arranged behind one another, of which:
 a first partial through-opening is formed in the first connection plate;
 a second partial through-opening is formed in the second connection plate; and
 a third partial through-opening is formed in the dielectric holder.

16. An electrical connection module system, comprising:
 a first connection plate comprising a first connection end and at least one first foot section;
 a second connection plate comprising a second connection end and at least one second foot section;
 a first screw nut;
 a second screw nut; and
 a dielectric holder comprising a first reception region for receiving the first screw nut,
 wherein the first connection plate, when the first screw nut is placed in the first reception region, can be pushed onto the dielectric holder so as to be brought into a first target position in which the first screw nut is arranged between the dielectric holder and the first connection end and is held by the first connection end in the first reception region in such a way that the first screw nut cannot fall out,
 wherein the dielectric holder further comprises a second reception region for receiving the second screw nut,
 wherein the second connection plate, when the second screw nut is placed in the second reception region, can be pushed onto the dielectric holder so as to be brought into a second target position such that the second screw nut is arranged between the dielectric holder and the second connection end and is held by the second connection end in the second reception region in such a way that the second screw nut cannot fall out,
 wherein, when the first connection plate is in the first target position and the second connection plate is in the second target position, a tongue-shaped projection of the dielectric holder is arranged between the first connection plate and the second connection plate.

17. The electrical connection module system of claim 16, wherein the dielectric holder comprises at least one first latch element which holds the first connection plate in the first target position.

18. The electrical connection module system of claim 16, wherein the first connection end comprises a first feed-through through which, when the first connection plate is in the first target position, a first screw can be fed and screwed to the first screw nut.

19. The electrical connection module system of claim 16, wherein the first reception region is configured so as to block the first screw nut placed in the first reception region in the event of rotation of the first screw nut about a thread axis of the first screw nut.

20. The electrical connection module system of claim 16, wherein the dielectric holder comprises at least one second latch element which holds the second connection plate in the second target position.

21. The electrical connection module system of claim 16, wherein the second connection end comprises a second feed-through through which, when the second connection plate is in the second target position, a second screw can be fed and screwed to the second screw nut.

22. The electrical connection module system of claim 16, further comprising one or more through-openings each of which comprises three partial through-openings arranged behind one another, of which:
 a first partial through-opening is formed in the first connection plate;
 a second partial through-opening is formed in the second connection plate; and
 a third partial through-opening is formed in the dielectric holder.

\* \* \* \* \*